United States Patent
Zheng et al.

(10) Patent No.: US 9,641,141 B1
(45) Date of Patent: May 2, 2017

(54) HARMONICS SUPPRESSION CIRCUIT FOR A SWITCH-MODE POWER AMPLIFIER

(71) Applicant: Hong Kong Applied Science & Technology Research Institute Company Limited, Hong Kong (HK)

(72) Inventors: Shiyuan Zheng, Hong Kong (HK); Zhiwei Wu, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days.

(21) Appl. No.: 15/055,733

(22) Filed: Feb. 29, 2016

(51) Int. Cl.
 *H03F 3/217* (2006.01)
 *H03F 1/02* (2006.01)
 *H03F 3/193* (2006.01)

(52) U.S. Cl.
 CPC .......... *H03F 3/2171* (2013.01); *H03F 1/0205* (2013.01); *H03F 3/193* (2013.01); *H03F 2200/129* (2013.01); *H03F 2200/451* (2013.01)

(58) Field of Classification Search
 CPC ....................................................... H03F 3/217
 USPC ...................................... 330/251, 207 A, 262
 See application file for complete search history.

(56) References Cited

U.S. PATENT DOCUMENTS

| | | | |
|---|---|---|---|
| 5,712,593 A | 1/1998 | Buer et al. | |
| 7,920,027 B2 * | 4/2011 | Keerti | ................... H03F 1/0261 330/262 |
| 8,350,555 B2 | 1/2013 | Kim et al. | |
| 8,860,497 B1 | 10/2014 | Pattnayak et al. | |
| 2012/0242407 A1 * | 9/2012 | Yan | ......................... H03F 1/303 330/251 |
| 2013/0106514 A1 * | 5/2013 | Forejt | .................... H03F 3/211 330/255 |
| 2013/0176077 A1 * | 7/2013 | Pai | ......................... H03F 1/223 330/278 |
| 2014/0038534 A1 | 2/2014 | Ciacci et al. | |

(Continued)

OTHER PUBLICATIONS

Lai, Jie-Wei et al. "A 0.27mm2 13.5dBm 2.4GHz All-Digital Polar Transmitter Using 34%-Efficiency Class-D DPA in 40nm CMOS", ISSCC 2013.

*Primary Examiner* — Henry Choe
(74) *Attorney, Agent, or Firm* — gPatent LLC; Stuart T. Auvinen

(57) ABSTRACT

Even harmonics are suppressed by a harmonics-reducing bias generator that drives bias voltages to cascode control transistors in series with driver transistors in a power amplifier. A first bias voltage is generated by mirroring pull-up currents in the power amplifier. A p-channel source transistor and a p-channel cascode current-mirror transistor also mirror the power amplifier pull-up current to a midpoint node. An n-channel sink transistor and an n-channel cascode current-mirror transistor mirror the pull-down current in the power amplifier to the midpoint node. An op amp compares the midpoint node to VDD/2, and drives the gate of a p-channel feedback transistor. Current from the p-channel feedback transistor flows through an n-channel cascode current-mirror transistor that generates a second bias voltage. The second bias voltage is adjusted until the midpoint node reaches VDD/2, causing the pull-up and pull-down currents in the power amplifier to better match, reducing even harmonics.

20 Claims, 9 Drawing Sheets

(56) References Cited

U.S. PATENT DOCUMENTS

2014/0132349 A1* 5/2014 Park .................. H03F 1/0272
330/267
2015/0153753 A1   6/2015 Fort et al.
2015/0162878 A1   6/2015 Ba
2016/0268971 A1* 9/2016 Seesink ................ H03B 5/364

* cited by examiner

| HD2 (dBc) | PROCESS CORNER | TT | FS | SF | RANGE |
|---|---|---|---|---|---|
| | FIXED VBP, VBN | -53.8 | -44.1 | -41.7 | 12.1 |
| | FG. 3 GEN VBP, VBN | -50.7 | -51.9 | -50.0 | 1.9 |

HARMONICS SUPPRESSION CIRCUIT FOR A SWITCH-MODE POWER AMPLIFIER

FIELD OF THE INVENTION

This invention relates to power amplifier circuits, and more particularly to suppression of harmonics in power amplifiers.

BACKGROUND OF THE INVENTION

Power amplifiers are categorized into several classes. Class-D power amplifiers are switched-mode amplifiers that are sometimes used to amplify a Pulse-Width-Modulated (PWM) input to generate a Radio-Frequency (RF) output that is phase modulated. Very high switching speeds may be used.

Unfortunately, even and odd harmonics are often generated above the fundamental frequency. These harmonics are undesirable as they can violate emission limits set by regulatory agencies such as the U.S. Federal Communications Commission (FCC).

High power transmitters require high power amplifiers that use large transistors. These large transistors switch large currents that are slow to change. Thus rise and fall times or edges of signals are slow and consume a relatively large portion of the period in a high frequency signal. Rising and falling edges may mismatch significantly. Distortions that are thought to create harmonic distortions may be caused by rising and falling edge mismatch, and duty-cycle mismatch when the rising and falling times cause the duty cycle to deviate from 50%.

What is desired is a switch-mode power amplifier with reduced harmonics. A power amplifier with harmonic suppression is desirable. A circuit that can suppress harmonics created by a power amplifier is desired.

DETAILED DESCRIPTION

The present invention relates to an improvement in harmonics suppression for power amplifiers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
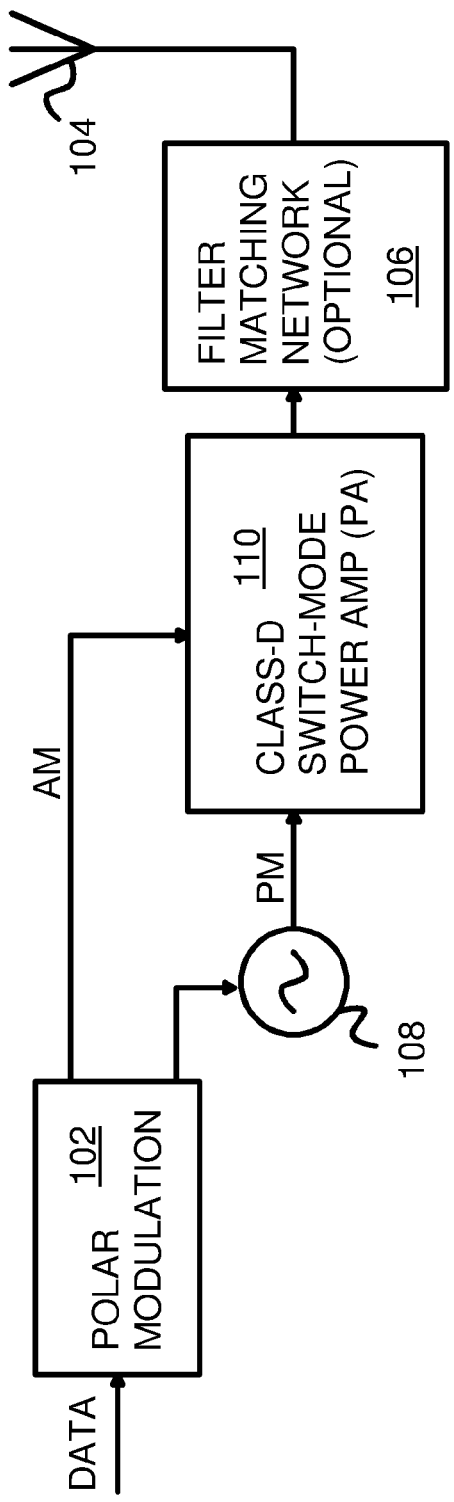
FIG. 1 is a block diagram of a Radio-Frequency (RF) polar transmitter.

FIG. 1 is a block diagram of a Radio-Frequency (RF) polar transmitter. Data to be transmitted is modulated by polar modulator 102 to generate Amplitude-Modulation (AM) and Phase Modulation (PM) signals. The phase or frequency of local oscillator 108 is modulated under the control of polar modulator 102 to generate a PM signal from the carrier generated by local oscillator 108.

Power amplifier 110 is a class-D switch-mode power amplifier that drives large currents to antenna 104 through filter matching network 106, which may contain inductors and capacitors to match the impedance of antenna 104. The amplitude of the output of power amplifier 110 may be adjusted or modulated by the AM signal from polar modulator 102, such as by changing a number of parallel transistors that are enabled to drive the output. The phase or frequency of the output signal from power amplifier 110 is modulated by the PM carrier signal from local oscillator 108.

Figure 2:
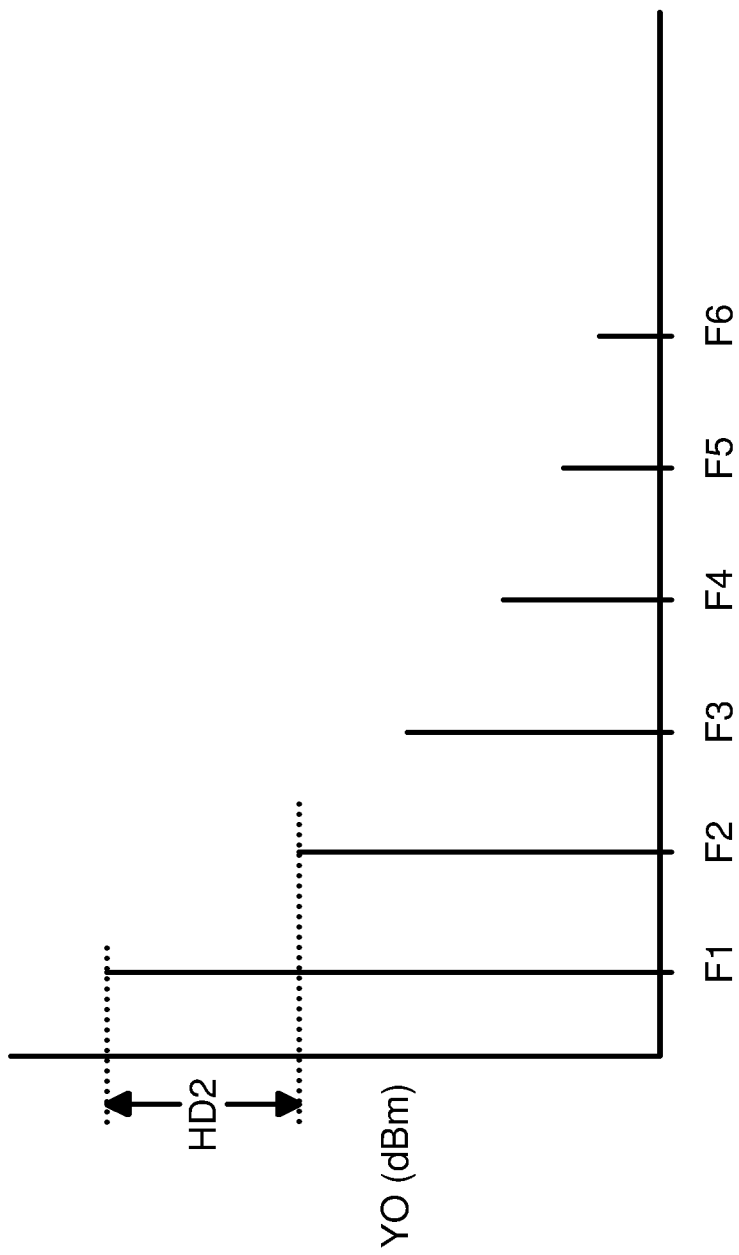
FIG. 2 is a graph showing a large second harmonics.

FIG. 2 is a graph showing a large second harmonics. When a standard power amplifier 110 is used, rising and falling edges of the output of power amplifier 110 may mismatch and distort the duty cycle, causing a large second harmonic. The fundamental frequency F1 is the frequency of the desired output signal. The even harmonics are F2, F4, F6, . . . while the odd harmonics are F3, F5, . . . . Since F2 is nearest to F1, it is the most difficult harmonic to be suppressed by the power-amplifier output filter. As the distance from the fundamental frequency increases, the power of each harmonic decreases with the order of the harmonic. The difference in signal strength between the fundamental F1 and the second harmonic F2 is HD2. HD2 is a measure of the worst-case harmonic distortion. For standard power amplifiers operating a high speeds, HD2 can be too large to meet FCC regulations. Power may have to be reduced, which may reduce reception range or increase reception errors.

Figure 3:
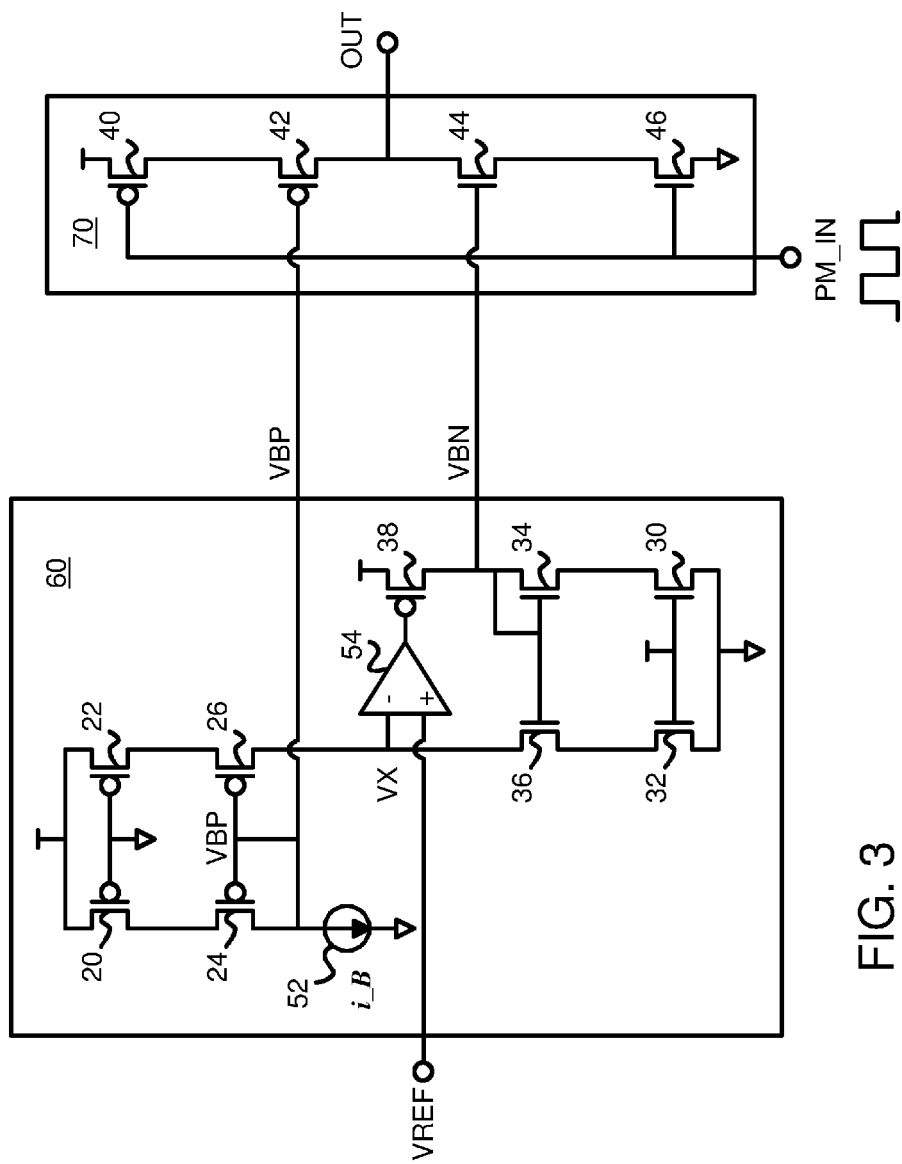
FIG. 3 is a reduced-harmonics power amplifier with a bias generation circuit to reduce output harmonics.

FIG. 3 is a reduced-harmonics power amplifier with a bias generation circuit to reduce output harmonics. Power amplifier 70 amplifies modulated carrier signal PM_IN that drives the gates of p-channel driver transistor 40 and n-channel driver transistor 46. Cascode control transistors 42, 44 are inserted between driver transistors 40, 46 and output OUT to balance the output rise and fall times. Balancing the output rise and fall times reduces mismatch which reduces harmonics.

P-channel cascode control transistor 42 has its gate driven by bias voltage VBP, while n-channel cascode control transistor 44 has its gate driven by bias voltage VBN. The values of VBP, VBN are generated by harmonics-reducing bias generator 60.

Harmonics-reducing bias generator 60 has current sink 52 drawing current from node VBP to ground. This current is pulled through cascode current-mirror transistor 24, which also has its gate tied to VBP. The current pulled through cascode current-mirror transistor 24 is sourced from the power supply through source transistor 20, which has its gate grounded. The amount of current i_B through current sink 52 and the sizes of cascode current-mirror transistor 24, source transistor 20 are selected by the circuit designer so that VBP has a desired value, such as 0.7*VDD.

Source transistors 20, 22 and cascode current-mirror transistors 24, 26 are p-channel transistors designed to match p-channel driver transistor 40 and p-channel cascode control transistor 42, but are 1/N of the size. For example, source transistor 20 may be ½0 of the size of p-channel drier transistor 40.

While VBP is set by current sink 52, VBN is controlled to match a midpoint voltage VX to a reference voltage VREF. When VREF is set to VDD/2, the current drives of p-channel cascode control transistor 42, n-channel cascode control transistor 44 are controlled to balance each other, causing the rise and fall times of the output to better match, reducing harmonics.

Midpoint voltage VX is compared to reference voltage VREF by op amp 54 to drive the gate of p-channel feedback transistor 38. Current from the power supply is provided through p-channel feedback transistor 38 to node VBN to set voltage VBN. This current from p-channel feedback transistor 38 is forced through n-channel cascode current-mirror transistor 34, which also has its gate connected to VBN, and then through n-channel sink transistor 30 to ground. The gate of n-channel sink transistor 30 is connected to power.

The pull-up current to midpoint node VX is controlled by p-channel midpoint source transistor 22 and p-channel midpoint cascode current-mirror transistor 26. These transistors are sized and biased to match the currents through source transistor 20 and cascode current-mirror transistor 24.

P-channel midpoint source transistor 22 also has its gate grounded to match the current through source transistor 20. P-channel cascode current-mirror transistor 26 also has its gate driven by VBP to match the current through cascode current-mirror transistor 24. However, the drain of cascode current-mirror transistor 26 is midpoint voltage VX, and connects to the drain of n-channel midpoint cascode current-mirror transistor 36. The current through n-channel midpoint cascode current-mirror transistor 36 is sunk to ground through n-channel midpoint sink transistor 32, which has its gate connected to power.

The pull-down current from midpoint node VX is thus matched to the currents through n-channel cascode current-mirror transistor 34, n-channel sink transistor 30, since n-channel midpoint cascode current-mirror transistor 36, n-channel midpoint sink transistor 32 are sized and biased to match that of n-channel cascode current-mirror transistor 34, n-channel sink transistor 30.

In operation, when midpoint voltage VX rises above VREF, the harmonic is increased in strength since the pull-up current in power amplifier 70 is stronger than the pull-down current in power amplifier 70, causing edge mismatch. To compensate and reduce the harmonic, harmonics-reducing bias generator 60 increases the pull-down current drive in power amplifier 70 by raising bias voltage VBN. Then n-channel cascode control transistor 44 increases current drive.

Op amp 54 detects that VX is above VREF, and reduces the voltage to the gate of p-channel feedback transistor 38 since VX is applied to the inverting (−) input of op amp 54. The lower voltage of the gate of p-channel feedback transistor 38 increases its current, causing VBN to rise as current increases through n-channel cascode current-mirror transistor 34. The higher VBN increases the drive in n-channel driver transistor 46, increasing the pull-down current to compensate. The even harmonics are reduced since the pull-down current increases to match the pull-up current. Edge mismatch is compensated for by harmonics-reducing bias generator 60.

The higher VBN also increases the pull-down current from midpoint node VX, since VBN is applied to the gate of n-channel midpoint cascode current-mirror transistor 36. Thus changes in the pull-down current in n-channel cascode control transistor 44 in power amplifier 70 are matched by n-channel midpoint cascode current-mirror transistor 36 in harmonics-reducing bias generator 60 to adjust the midpoint voltage VX.

VREF can be set to half of the power supply voltage, or VDD/2, when the input has a 50% duty cycle and a π conduction angle. The ratio of pull-up and pull-down driving capabilities of power amplifier 70 can be adjusted by adjusting VREF. When using VREF=VDD/2 and 50% duty cycles, even harmonics can be suppressed.

Figures 4, 5:
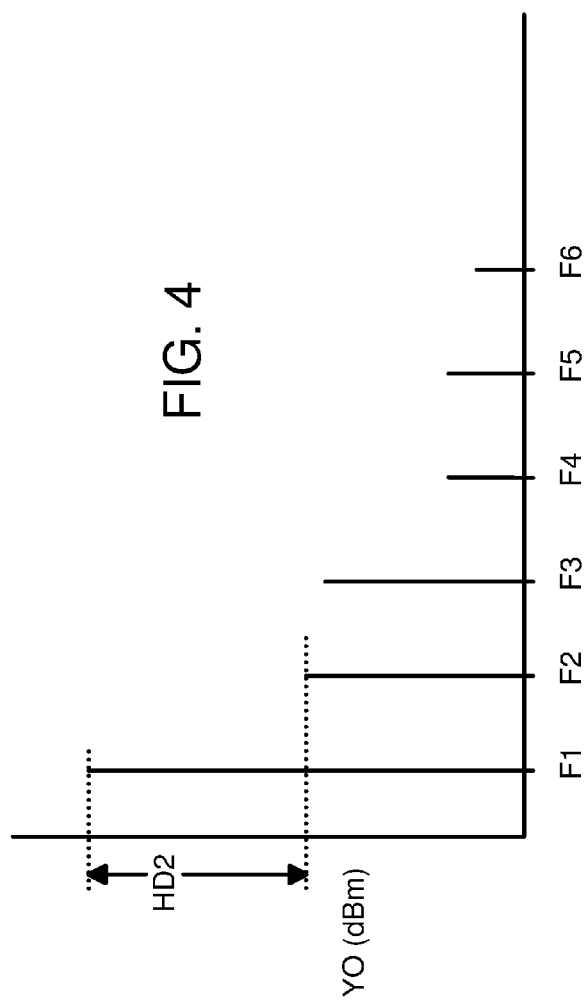
FIG. 4 is a graph showing a reduced harmonic using the circuit of FIG. 3.
FIG. 5 is a chart showing simulated harmonic reduction using the harmonics-reducing bias generator and power amplifier.

FIG. 4 is a graph showing a reduced harmonic using the circuit of FIG. 3. The difference in strength of the fundamental F1 and second harmonic F2 is HD2. The even harmonics F2, F4, F6, have been reduced by using harmonics-reducing bias generator 60 of FIG. 3. VREF is set to VDD/2 and a 50% input duty cycle is used.

FIG. 5 is a chart showing simulated harmonic reduction using the harmonics-reducing bias generator and power amplifier. The difference in strengths of F1 and F2 are shown in decibels (dBc). Several process corners are shown, such as Typical-Typical (TT), Fast-Slow (FS), and Slow-Fast (FS). Slow-Fast means that the n-channel transistors are slow and the p-channel transistors are fast (higher that typical current drive).

The first row of the chart shows that using a standard power amplifier with fixed biases VBP, VBN, as a range of HD2 values from −53.8 for Typical-Typical to −41.7 dBc for Slow-Fast. This is a large range of 12.1 dBc across the process corners. The HD2 value of −41.7 dBc for Slow-Fast may be not low enough to meet the FCC emissions requirements when the desired output power is larger than 0 dBm.

When harmonics-reducing bias generator 60 of FIG. 3 is used to generate bias voltages VBP, VBN, the values of HD2 have much less variation with process corners, since harmonics-reducing bias generator 60 tracks these variations better than a fixed bias voltage. Using harmonics-reducing bias generator 60, the range across process corners is only 1.9 dBc, much less than 12.1 dBc using fixed biases. Thus harmonics-reducing bias generator 60 is very effective in reducing process variations.

Also, the worst-case harmonic distortion HD2 is increased from −41.7 dBc for SF fixed biases, to −50.0 dBc when using harmonics-reducing bias generator 60. The worst-case harmonic is suppressed by over 8 decibels using harmonics-reducing bias generator 60.

Figure 6:
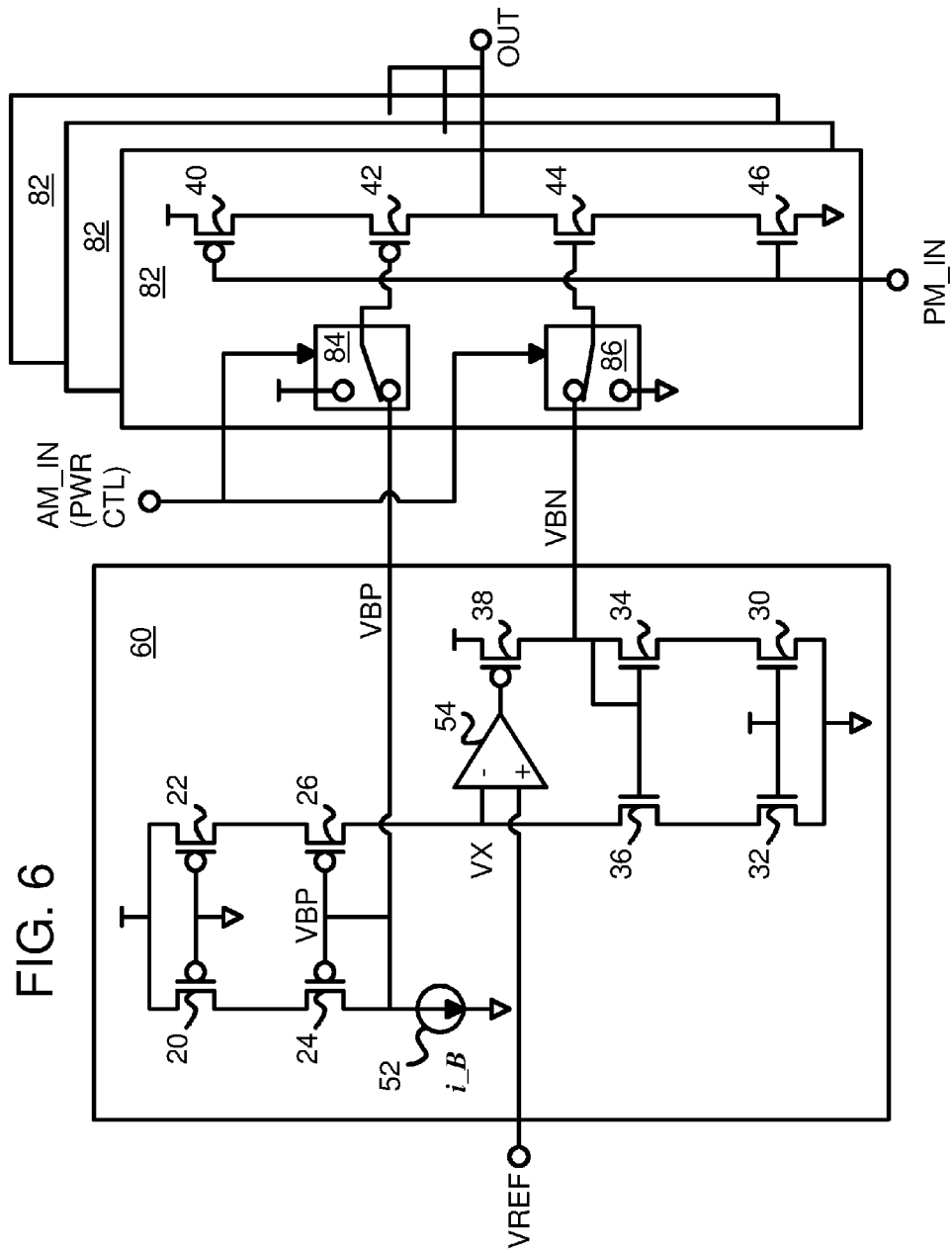
FIG. 6 shows an alternative using many power amplifier cells that can be switched on and off for amplitude modulation or to adjust output current.

FIG. 6 shows an alternative using many power amplifier cells that can be switched on and off for amplitude modulation or to adjust output current. Many power amplifier cells 82 are connected in parallel, each driving output OUT and each receiving PM_IN on the gates of p-channel drier transistor 40, n-channel driver transistor 46. Some of power amplifier cells 82 can be switched off by a power control signal. The power control signal may be derived from the AM signal from polar modulator 102 (FIG. 1) or may be driven by a programmable register.

Switch 84 drives the gate of p-channel cascode control transistor 42 high to turn off the pull-up current when AM_IN is low. When AM_IN is high, switch 84 passes through VBP. Switch 86 drives the gate of n-channel cascode control transistor 44 low to turn off the pull-down current when AM_IN is low. When AM_IN is high, switch 86 passes VBN through and power amplifier cell 82 operates as does power amplifier 70.

AM_IN may be a multi-bit value that is decoded to produce separate AM_IN signals to each of the power amplifier cells 82 so that some power amplifier cells 82 may be turned off and other power amplifier cells 82 turned on. Thus the current drive to output OUT may be varied using AM_IN. AM_IN could also be an analog value that is converted to a multi-bit digital value by an analog-to-digital converter (ADC) or equivalent.

Harmonics-reducing bias generator 60 may be shared by some or all of power amplifier cells 82. When a large number of power amplifier cells 82 are used, it may be better to have two or more harmonics-reducing bias generator 60, each driving a subset of power amplifier cells 82. Several power amplifier cells 82 could share one control signal derived from AM_IN, and various encoding schemes could be used for AM_IN, such as thermometer, binary, gray code, powers-of-2, etc.

Figure 7:
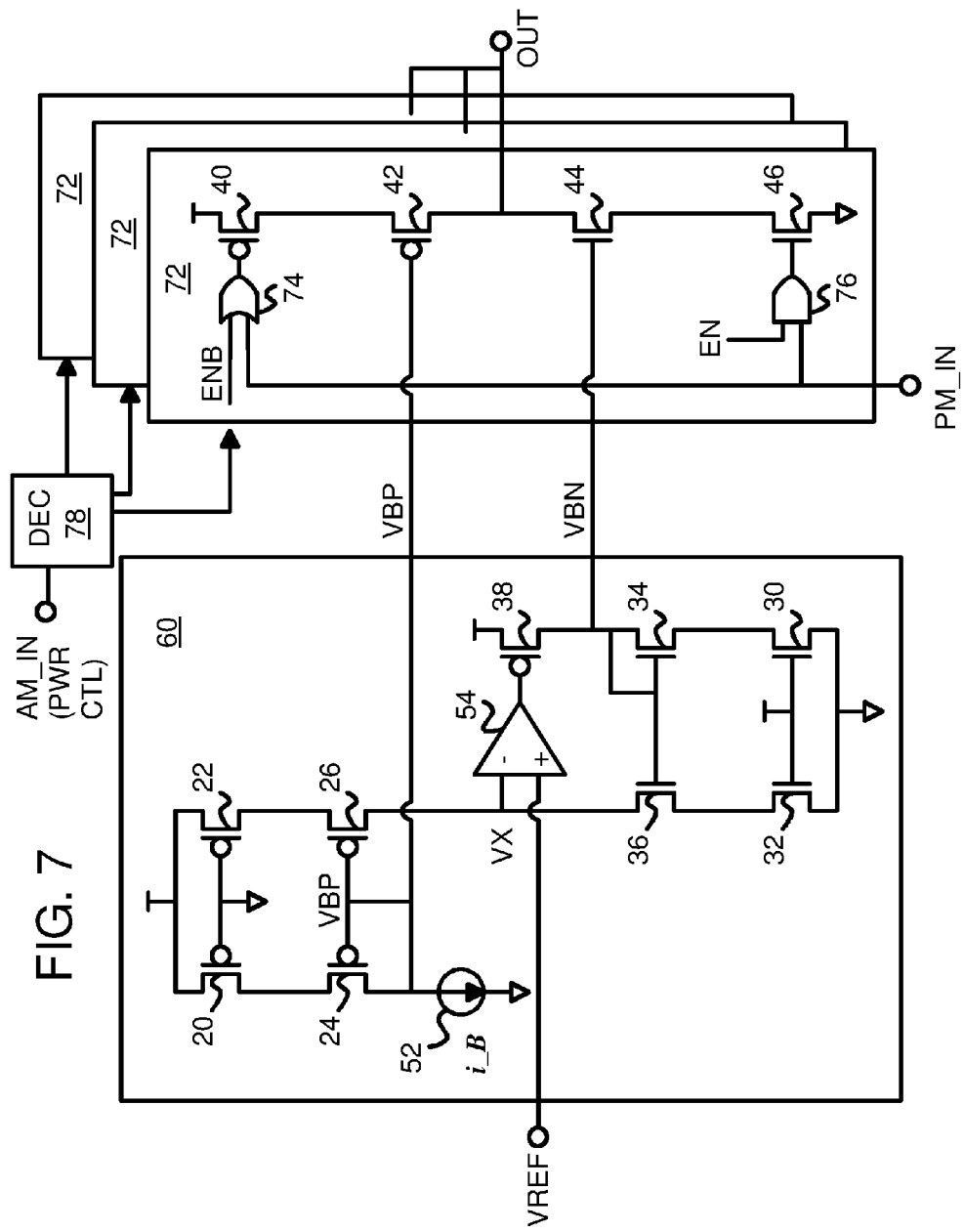
FIG. 7 is another alternative using many power amplifier cells that are gated on and off.

FIG. 7 is another alternative using many power amplifier cells that are gated on and off. Decoder 78 decodes AM_IN to generate separate enable signals EN, ENB for each of power amplifier cells 72. OR gate 74 drives the gate of p-channel driver transistor 40 high to disable a power amplifier cell 72 when ENB is high, while AND gate 76 drives the gate of n-channel driver transistor 46 low when EN is low to disable the cell. When EN is high and ENB is low, PM_IN is passed through gates 74, 76 to enable power amplifier cell 72.

Figure 8:
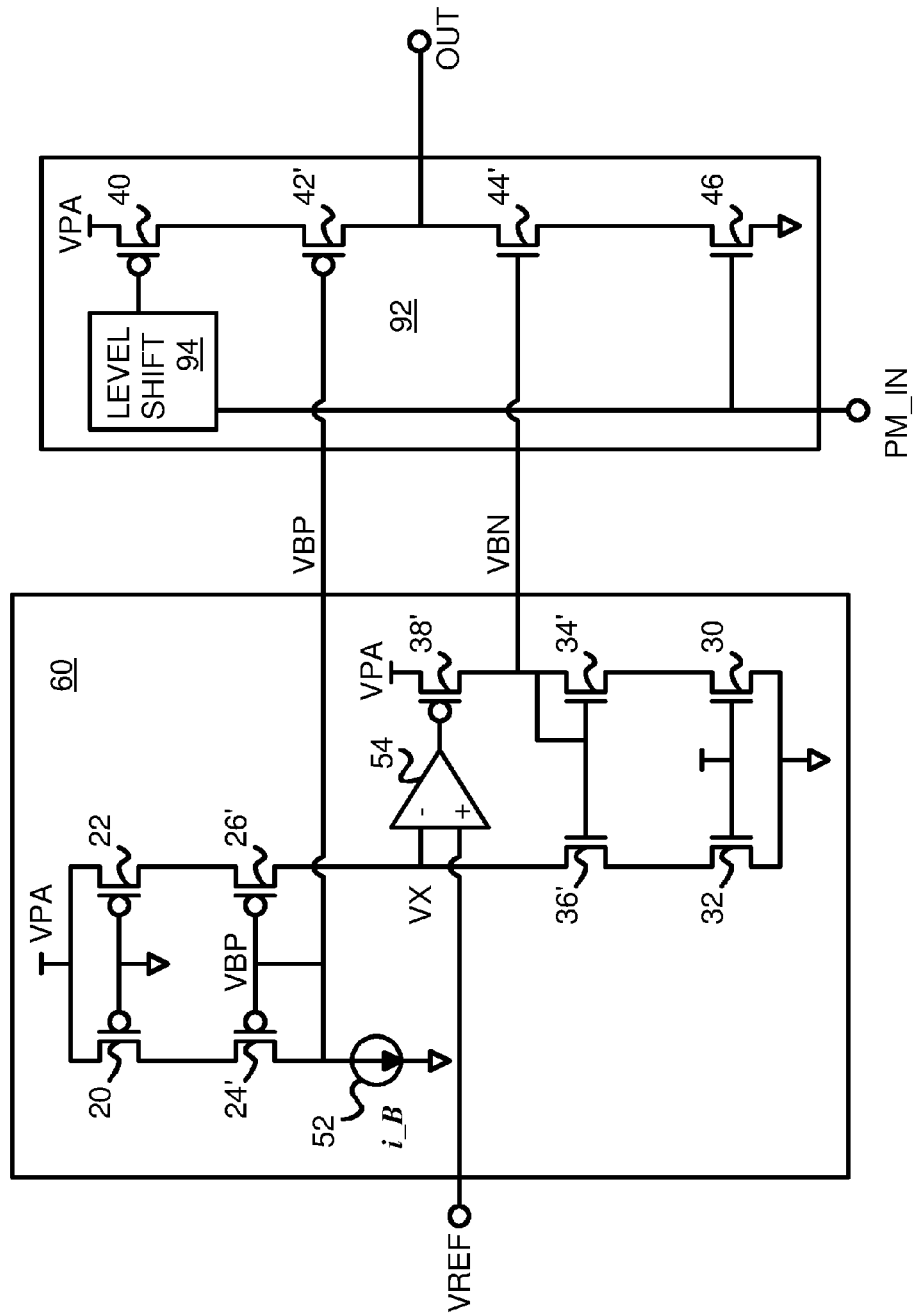
FIG. 8 shows using a voltage booster to increase pull-up current drive in the power amplifier.

FIG. 8 shows using a voltage booster to increase pull-up current drive in the power amplifier. Level shifter 94 boosts a high voltage to a level above VDD to drive the gate of p-channel driver transistor 40 high. A boosted VDD, VPA, may be applied to the sources of p-channel driver transistor 40, source transistor 20, P-channel midpoint source transistor 22, and p-channel feedback transistor 38. Longer gate lengths and/or thicker oxides may be used for transistors 42', 44', 24', 26', 34', 36', 38' to allow for a higher VBP bias voltage.

Figure 9:
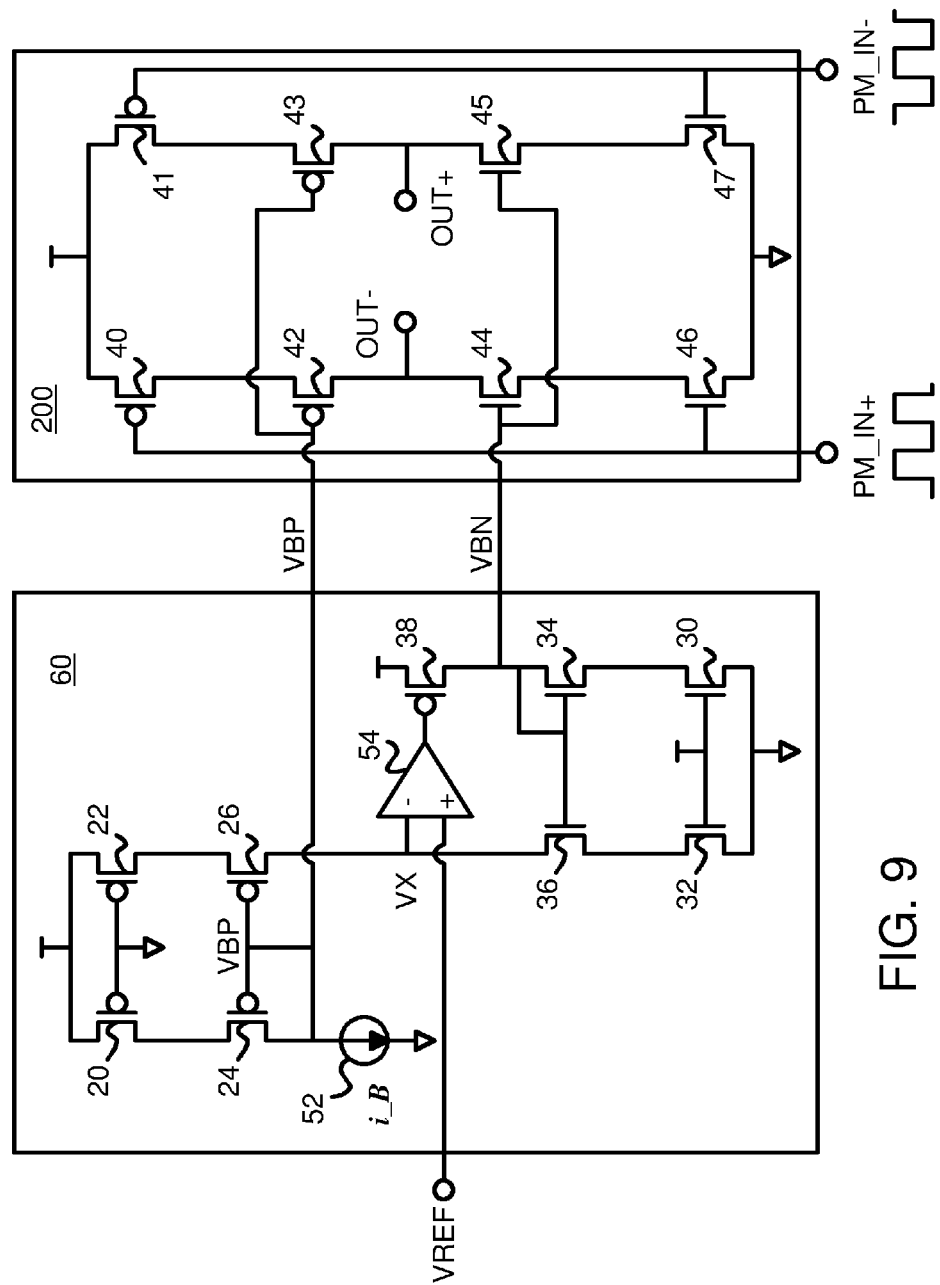
FIG. 9 shows a fully differential power amplifier using a harmonics-reducing bias generator.

FIG. 9 shows a fully differential power amplifier using a harmonics-reducing bias generator. Differential power amplifier 200 has a true input PM_IN+ and a complement input PM_IN−, and a true differential output OUT+ and a complement differential output OUT−. P-channel driver transistor 40 and n-channel driver transistor 46 receive PM_IN+ and drive OUT− through p-channel cascode control transistor 42, n-channel cascode control transistor 44. In a second driver leg, P-channel driver transistor 41 and n-channel driver transistor 47 receive PM_IN− and drive OUT+ through p-channel cascode control transistor 43, n-channel cascode control transistor 45.

VBP is applied to the gates of p-channel cascode control transistors 42, 43, while VBN is applied to the gates of n-channel cascode control transistors 44, 45. Harmonics-reducing bias generator 60 controls biases to both true and complement legs of differential power amplifier 200. PM_IN+ and PM_IN− can be rail-to-rail signals while OUT+, OUT− can be small-signals having a reduced voltage swing.

Figure 10:
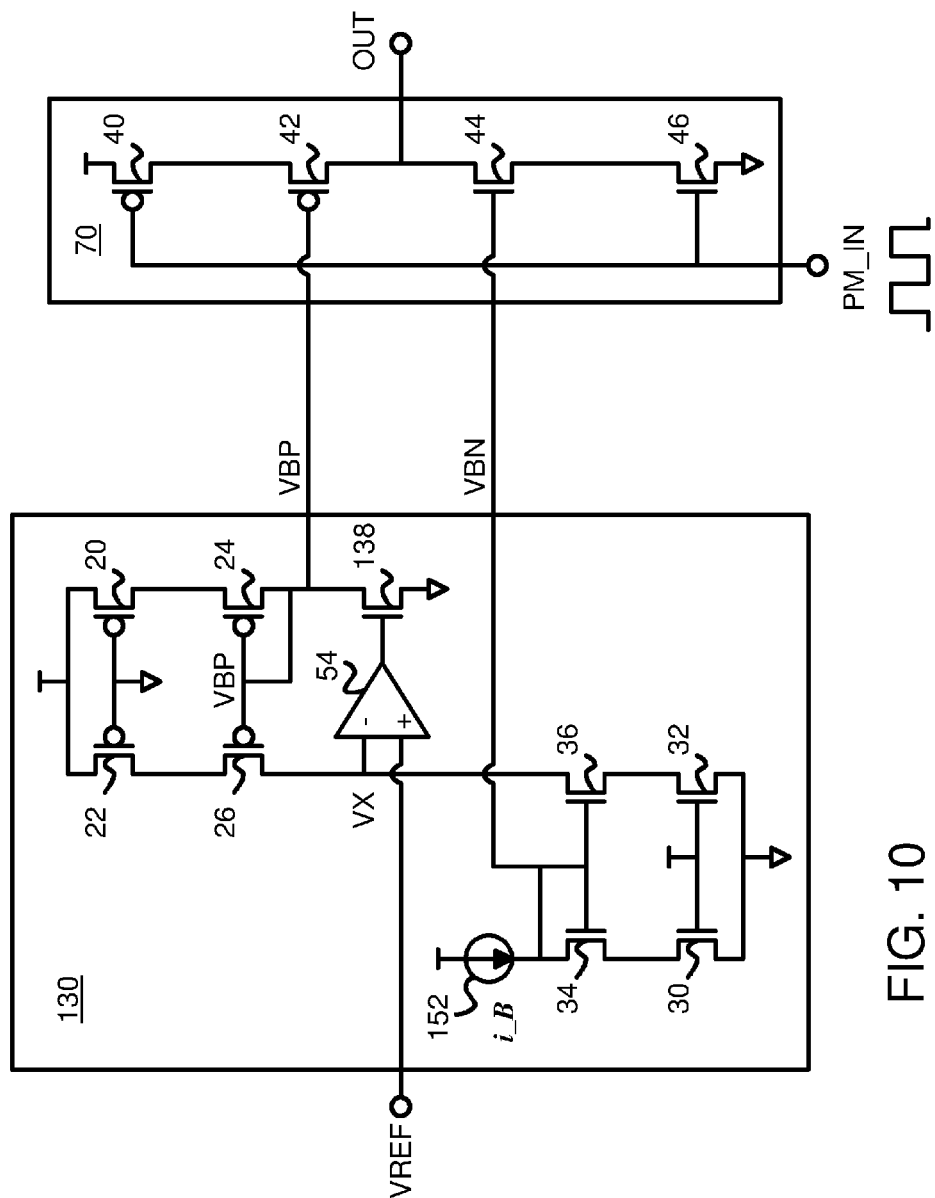
FIG. 10 shows a power amplifier using a harmonics-reducing bias generator with p-channel feedback rather than n-channel feedback.

FIG. 10 shows a power amplifier using a harmonics-reducing bias generator with p-channel feedback rather than n-channel feedback. In this alternative, harmonics-reducing bias generator 130 has current source 152 generate a bias current to VBN that flows through n-channel cascode current-mirror transistor 34 and n-channel sink transistor 30 to set VBN. Mirrored currents through n-channel midpoint cascode current-mirror transistor 36, n-channel midpoint sink transistor 32 produce a pull-down current to midpoint node VX. The pull-up current to midpoint node VX is generated by p-channel midpoint cascode current-mirror transistor 26 and p-channel midpoint source transistor 22 that mirror currents in cascode current-mirror transistor 24 and source transistor 20.

Op amp 54 compares VX to VREF and drives the gate of n-channel feedback transistor 138, which varies the sink current from VBP. VBP is adjusted by the feedback loop rather than VBN.

If the p-channel transistors are too strong relative to the n-channel transistors in power amplifier 70, then p-channel midpoint source transistor 22 and p-channel midpoint cascode current-mirror transistor 26 pull VX higher than VREF. Op amp 54 drives the gate of n-channel feedback transistor 138 lower, reducing the current pulled from VBP and through cascode current-mirror transistor 24. This causes VBP to rise, reducing the current drives of p-channel cascode control transistor 42 and p-channel midpoint cascode current-mirror transistor 26. This allows VX to fall until reaching VREF, while also reducing the pull-up current drive to output OUT. The pull-up and pull-down current drives of power amplifier 70 eventually reach equilibrium when VX reaches VREF, matching rising and falling edges and reducing harmonics.

Alternate Embodiments

Several other embodiments are contemplated by the inventors. For example various combinations of the embodiments and alternatives are possible. Multiple power amplifier cells 72 or power amplifier cells 82 could replace power amplifier 70 in FIGS. 8-10, with modifications such as adding level shifters, differential legs, or using p-channel feedback in harmonics-reducing bias generator 60.

The sizes of transistors in harmonics-reducing bias generator 60 can be a fraction of transistor sizes in power amplifier 70, 1/N, such as ¼, ⅛, 1/25, etc. to reduce the size and power of harmonics-reducing bias generator 60. Transistors can otherwise be matched, and may have the same shape, geometry, orientation, contact taps, etc.

Within harmonics-reducing bias generator 60, transistors 20, 24 can be a different size than transistors 22, 26, such as one-quarter size, and be an even smaller fraction of the size of transistors 40, 42. Likewise, transistors 44, 46 could be full size, transistors 34, 30 could be ¼ size, and transistors 36, 32 could be ⅛ size, as one of many examples. P-channel cascode control transistor 42 may have a different size than p-channel driver transistor 40, and p-channel sizes may be larger than the corresponding n-channel sizes to account for lower hole mobility.

Current sink 52 could be replaced with a transistor current sink or a resistor. Current source 152 could likewise be implemented with a transistor or a resistor. Op amp 54 can be a comparator. The input duty cycle of PM_IN is 50% within a small range, such as +/−5%. PM_IN may be a square wave in its approximate shape.

Feedback transistor 38 could be p-channel or n-channel and op amp 54 could be inverting or non-inverting, and its inputs could be swapped for inversion.

Various ratios of transistor sizes could be used, or exact matching of transistor sizes, shapes, and orientations. The substrate or bulk connections of p-channel transistors may be tied to the highest voltage, such as VDD or VCC, or to a substrate or back-bias voltage, or to the transistor sources.

Likewise, n-channel transistors may have bulk or substrates tied to ground or to a negative voltage or to their sources.

The current source or sink could be implemented as n-channel or p-channel transistors having gates receiving a fixed voltage. Bias voltages could be generated by bias generators such as a resistor divider or a series of transistors.

Various theories of operation have been presented to try to explain operation. These theories are approximations of real, often complex, physical behaviors. These theories may be incorrect, although useful for designing driver circuits. The invention is not limited by these theories and does not depend on these theories being correct.

The circuit designer may choose resistors, capacitors, transistors, and other components to have a ratio that produces the desired voltages. While Complementary-Metal-Oxide-Semiconductor (CMOS) transistors have been described, other transistor technologies and variations may be substituted, and materials other than silicon may be used, such as Galium-Arsinide (GaAs) and other variations. DMOS, LDMOS, and diffusion-enhanced transistors may be used. Bipolar transistors could also be used, such as for output driver transistors.

Timings may be adjusted by adding delay lines or by controlling delays in leading-edge blocking units. Pulse generators could also be added. The outputs or control signals may be swapped to add an inversion. Inverting and non-inverting inputs may be swapped and the polarity of the output reversed.

Separate power supplies and grounds may be used for some components. The bulk or substrate nodes may be tied to power for p-channel transistors, and to ground for n-channel transistors, or a substrate bias generate be used to generate bulk voltages. Various filters could be added. Active low rather than active high signals may be substituted. The signals applied to the gates of p-channel and n-channel transistors may be switched to power or ground to power down the circuit.

The bias voltages may be fixed, or may be adjustable, such as to track temperature, process, or power-supply voltage. The reference current i_B may likewise be fixed, or may be adjustable to track temperature, process, or supply voltage. Band-gap references may be used.

While positive currents have been described, currents may be negative or positive, as electrons or holes may be considered the carrier in some cases. Source and sink currents may be interchangeable terms when referring to carriers of opposite polarity. Currents may flow in the reverse direction.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A harmonics-suppressing power amplifier comprising:
an input for receiving a square-wave input having a 50% duty cycle;
a p-channel driver transistor having a gate controlled by the input;
a p-channel cascode control transistor having a gate controlled by a first bias;
an n-channel cascode control transistor having a gate controlled by a second bias;
an n-channel driver transistor having a gate controlled by the input;
an output that is driven by a pull-up current through the p-channel driver transistor and the p-channel cascode control transistor in series, and that is driven by a pull-down current through the n-channel driver transistor and the n-channel cascode control transistor in series;
wherein even-order harmonics are created by a mis-match of the pull-up and pull-down currents to the output;
a harmonics-reducing bias generator comprising:
a p-channel bias generator having a current sink that pulls current through a cascode current-mirror transistor to generate the first bias voltage;
a midpoint generator that generates a midpoint node by mirroring the pull-up current and the pull-down current to the output;
an op amp that compares the midpoint node to a reference voltage to generate a feedback voltage;
a feedback transistor that receives the feedback voltage on a gate and drives a feedback current to a second bias node; and an n-channel cascode current-mirror transistor that receives the feedback current from the second bias node, and has a gate and a drain connected to the second bias node to generate the second bias on the second bias node;

wherein the midpoint node is compared to the reference voltage to provide feedback to adjust the second bias to reduce mis-match of the pull-up and pull-down currents to reduce the even-order harmonics.

2. The harmonics-suppressing power amplifier of claim 1 wherein the reference voltage is half of a power supply voltage.

3. The harmonics-suppressing power amplifier of claim 2 wherein the midpoint generator comprises:
 a p-channel midpoint source transistor having a grounded gate;
 a p-channel midpoint cascode current-mirror transistor having a gate receiving the first bias;
 wherein the p-channel midpoint source transistor and the p-channel midpoint cascode current-mirror transistor are in series between a power supply and the midpoint node;
 an n-channel midpoint sink transistor giving a gate connected to the power supply;
 an n-channel midpoint cascode current-mirror transistor having a gate receiving the second bias;
 wherein the n-channel midpoint sink transistor and the n-channel midpoint cascode current-mirror transistor are in series between the midpoint node and a ground.

4. The harmonics-suppressing power amplifier of claim 3 wherein the p-channel midpoint source transistor is 1/N a size of the p-channel driver transistor;
 wherein the p-channel midpoint cascode current-mirror transistor is 1/N a size of the p-channel cascode control transistor;
 wherein the n-channel midpoint cascode current-mirror transistor is 1/N a size of the n-channel cascode control transistor;
 wherein the n-channel midpoint sink transistor is 1/N a size of the n-channel driver transistor;
 wherein N is a whole number or at least 2;
 wherein the pull-up and pull-down currents to the output are a multiple of pull-up and pull-down currents to the midpoint node.

5. The harmonics-suppressing power amplifier of claim 3 wherein the p-channel bias generator comprises:
 the cascode current-mirror transistor being a p-channel cascode current-mirror transistor having a gate and a drain connected to a first bias node to generate the first bias;
 a p-channel source transistor having a grounded gate and conducting between a power supply and the p-channel cascode current-mirror transistor; and
 the current sink connected between the first bias node and a ground.

6. The harmonics-suppressing power amplifier of claim 5 further comprising:
 an n-channel sink transistor having a gate connected to the power supply, for conducting current from the n-channel cascode current-mirror transistor to a ground.

7. A reduced-harmonics amplifier comprising:
 a power amplifier stage comprising:
  an n-channel driver transistor and a n-channel cascode control transistor having channels in series between a ground and an output;
  a p-channel driver transistor and a p-channel cascode control transistor having channels in series between a power supply and the output;
 a harmonics-reducing bias generator comprising:
  a p-channel source transistor and a p-channel cascode current-mirror transistor having channels in series between the power supply and a first bias node;
  a current sink for sinking a bias current from the first bias node;
  wherein a gate and a drain of the p-channel cascode current-mirror transistor are connected together and to the first bias node to set a first bias voltage on the first bias node;
  wherein the first bias voltage is applied to a gate of the p-channel cascode control transistor;
  an n-channel sink transistor and an n-channel cascode current-mirror transistor having channels in series between a ground and a second bias node;
  a feedback transistor that supplies a bias current to the second bias node in response to a gate receiving a feedback node;
  wherein a gate and a drain of the n-channel cascode current-mirror transistor are connected together and to the second bias node to set a second bias voltage on the second bias node;
  a p-channel mid source transistor and a p-channel mid cascode current-mirror transistor in series between the power supply and a midpoint node;
  an n-channel mid cascode current-mirror transistor and a n-channel mid sink transistor in series between the midpoint node and the ground;
  wherein the second bias voltage is applied to a gate of the n-channel mid cascode current-mirror transistor;
  wherein the first bias voltage is applied to a gate of the p-channel mid cascode current-mirror transistor;
  an op amp that compares the midpoint node to a reference voltage to generate the feedback node.

8. The reduced-harmonics amplifier of claim 7 wherein the reference voltage is half of a power supply voltage;
 wherein an input applied to gates of the p-channel driver transistor and the n-channel driver transistor has a 50% duty cycle;
 whereby harmonics are reduced by adjusting the second bias voltage to reduce up and down current mismatches to the output.

9. The reduced-harmonics amplifier of claim 8 further comprising:
 a plurality of the power amplifier stage connected in parallel to the output, each power amplifier stage receiving the input;
 a plurality of stage enable signals, each stage enable signal for enabling or disabling a power amplifier stage to adjust a maximum amplitude of the output.

10. The reduced-harmonics amplifier of claim 9 wherein each power amplifier stage further comprises:
 an OR gate receiving an inverse of a stage enable signal and the input, for applying the input to a gate of the p-channel driver transistor when the stage enable signal is active;
 an AND gate receiving the stage enable signal and the input, for applying the input to a gate of the n-channel driver transistor when the stage enable signal is active;
 wherein the first bias voltage is applied to a gate of the p-channel cascode control transistor;
 wherein the second bias voltage is applied to a gate of the n-channel cascode control transistor, wherein power amplifier stages are disabled by the OR gate driving the gate of the p-channel driver transistor high and by driving the gate of the n-channel driver transistor low.

11. The reduced-harmonics amplifier of claim 9 wherein each power amplifier stage further comprises:
a first switch that connects the first bias node to a gate of the p-channel cascode control transistor when a stage enable signal is active, and drives a high voltage to the gate of the p-channel cascode control transistor when the stage enable signal is not active
a second switch that connects the second bias node to a gate of the n-channel cascode control transistor when the stage enable signal is active, and drives a ground voltage to the gate of the n-channel cascode control transistor when the stage enable signal is not active;
wherein the input is applied to gates of the p-channel driver transistor and the n-channel driver transistor,
whereby power amplifier stages are disabled by blocking bias voltages.

12. The reduced-harmonics amplifier of claim 11 further comprising:
a polar modulator that receives a transmission input and generates an Amplitude-Modulation (AM) signal and a Phase Modulation (PM) signal from information in the transmission input;
a local oscillator that is controlled by the PM signal to generate the input, wherein the input is a phase-modulated input applied to the gates of the p-channel driver transistor and of the n-channel driver transistor;
a decoder that receives the AM signal and decodes the AM signal to generate a plurality of enable signals for the plurality of power amplifier stages, wherein a number of the power amplifier stages that are enabled is modulated by the AM signal to modulate an amplitude of the output.

13. The reduced-harmonics amplifier of claim 12 further comprising:
an antenna for transmitting the output using Radio-Frequency (RF) radiation; and
a filter network coupled between the output and the antenna, the filter network for matching impedances.

14. The reduced-harmonics amplifier of claim 8 further comprising:
a level shifter that receives the input and generates a boosted input having a high voltage above a power supply voltage;
wherein the boosted input is applied to a gate of the p-channel driver transistor;
wherein the input is applied to a gate of the n-channel driver transistor.

15. The reduced-harmonics amplifier of claim 14 wherein the p-channel driver transistor, the p-channel cascode control transistor, and the n-channel cascode control transistor each have a thicker gate oxide than the n-channel driver transistor.

16. The reduced-harmonics amplifier of claim 8 wherein the input is a differential input having a true input and a complement input that are complements of each other;
wherein the output is a differential output having a true output and a complement output that are complements of each other;
wherein the p-channel driver transistor and the n-channel driver transistor have gates receiving the true input;
wherein the p-channel cascode control transistor and the n-channel cascode control transistor have drains connected to the complement output;
further comprising:
a second p-channel driver transistor having a gate receiving the complement input;
a second n-channel driver transistor having a gate receiving the complement input;
a second p-channel cascode control transistor having a gate receiving the first bias voltage, and connected between the second p-channel driver transistor and the true output;
a second n-channel cascode control transistor having a gate receiving the second bias voltage, and connected between the second n-channel driver transistor and the true output.

17. A power amplifier with suppressed even harmonics comprising:
an input;
a p-channel driver transistor having a gate receiving the input and connected between a power supply and a first connecting node;
a p-channel cascode control transistor having a gate receiving a first bias and connected between the first connecting node and an output node;
an n-channel cascode control transistor having a gate receiving a second bias and connected between the output node and a second connecting node;
an n-channel driver transistor having a gate receiving the input and connected between a ground and the second connecting node;
a harmonics-reducing bias generator that comprises:
a p-channel cascode current-mirror transistor having a gate and a drain connected to a first bias node to set the first bias;
a source transistor that supplies current to the p-channel cascode current-mirror transistor;
a first bias sink for sinking a current from the first bias node;
an n-channel cascode current-mirror transistor having a gate and a drain connected to a second bias node to set the second bias;
a sink transistor that sinks current from the n-channel cascode current-mirror transistor;
a second bias source for sourcing a current to the second bias node;
a p-channel midpoint source transistor coupled between the power supply and an upper mid node;
a p-channel midpoint cascode current-mirror transistor having a gate receiving the first bias and coupled between the upper mid node and a midpoint node;
an n-channel midpoint cascode current-mirror transistor having a gate receiving the second bias and coupled between a lower mid node and the midpoint node;
an n-channel midpoint sink transistor coupled between the lower mid node and the ground;
a comparator that receives the midpoint node and a reference voltage and drives a feedback node;
wherein the feedback node is applied to the second bias source to adjust the current sourced from the second bias node, or is applied to the first bias sink to adjust the current sunk from the first bias node,
whereby the midpoint node is compared to the reference voltage to adjust the first bias or the second bias to reduce current mismatches to the output node to reduce harmonics.

18. The power amplifier with suppressed even harmonics of claim 17 wherein the reference voltage is half of a power supply voltage of the power supply;

wherein the input is a square wave having a 50% duty cycle and rail-to-rail swings, wherein output currents are adjusted to balance rising and falling edges to reduce even harmonics caused by edge mismatch.

19. The power amplifier with suppressed even harmonics of claim 18 wherein the second bias source is a p-channel feedback transistor having a gate receiving the feedback node;

wherein the first bias sink is a fixed current sink having a current from the first bias node that does not vary with the feedback node;

wherein the feedback node is applied to the second bias source to adjust the current sourced to the second bias node, whereby the second bias is adjusted by comparison of the midpoint node to the reference voltage.

20. The power amplifier with suppressed even harmonics of claim 18 wherein the second bias source is a fixed current source having a current to the second bias node that does not vary with the feedback node;

wherein the first bias sink is an n-channel feedback transistor having a gate receiving the feedback node;

wherein the feedback node is applied to the first bias sink to adjust the current sourced from the first bias node, whereby the first bias is adjusted by comparison of the midpoint node to the reference voltage.

\* \* \* \* \*